(12) United States Patent
Ogawa et al.

(10) Patent No.: US 6,232,003 B1
(45) Date of Patent: May 15, 2001

(54) SLIDING MEMBER

(75) Inventors: Katsuaki Ogawa; Keiichi Kanemitsu, both of Yono (JP)

(73) Assignee: Nippon Piston Ring CO, Ltd., Yono (JP)

(*) Notice: Subject to any disclaimer, the term of this patent is extended or adjusted under 35 U.S.C. 154(b) by 0 days.

(21) Appl. No.: 09/379,501

(22) Filed: Aug. 24, 1999

(30) Foreign Application Priority Data

Aug. 24, 1998 (JP) .................................................. 10-236657
Feb. 18, 1999 (JP) .................................................. 11-039871

(51) Int. Cl.$^7$ .............................. B23B 15/04; B23P 15/06
(52) U.S. Cl. ......................... 428/698; 428/469; 428/702
(58) Field of Search ..................................... 428/698, 469, 428/702, 704; 384/907, 912, 913; 29/888.04

(56) References Cited

U.S. PATENT DOCUMENTS 4,702,769 * 10/1987 Fukuhara et al. .
5,370,364 * 12/1994 Kenmoku et al. .
5,503,912 *  4/1996 Setoyama et al. .
5,993,978 * 11/1999 Kim et al. .

FOREIGN PATENT DOCUMENTS 8296030  11/1996 (JP) .

OTHER PUBLICATIONS

Rother et al. Effects of low boron concentration on the thermal stability of hard coatings. Surface and Coatings Technology, pp. 163–168, Feb. 1997.*
Meunier et al. X–Ray diffractometry analysis of r.f. magnetron–sputtered chromium/chromium nitride coatings. Surface and Coatings Technology, pp. 149–158, Jun. 1998.*
Collard et al. The reactive magnetron deposition of CrNxOy films: first results of property investigations. Surface and Coatings Technology, pp. 181–184, Feb. 1997.*

* cited by examiner

Primary Examiner—Deborah Jones
Assistant Examiner—Jennifer McNeil
(74) Attorney, Agent, or Firm—Birch, Stewart, Kolasch & birch, LLP

(57) ABSTRACT

According to an embodiment of the present invention, an improved sliding member is provided that has a sliding surface and a deposition layer formed on the sliding surface by means of an ion-plating method, where the deposition layer is composed mainly of chrome nitride, including CrN. The improvement comprises the CrN of the chrome nitride which has a preferred orientation of the plane {100}, where the deposition layer contains boron at a containing ratio not less than 0.05 and not more than 20 weight percent. According to another embodiment of the present invention, an improved sliding member is provided that has a sliding surface and a deposition layer formed on the sliding surface by means of an ion-plating method, where the deposition layer is composed mainly of chrome nitride, including CrN. The improvement comprises the CrN of the chrome nitride which has a preferred orientation of the plane {100}, where the deposition layer contains boron, at a containing ratio not less than 0.05 and not more than 20 weight percent, and either one or both of oxygen and carbon, at a containing ratio of the either one of oxygen and carbon, or a total containing ratio of both oxygen and carbon, not more than 15 weight percent, respectively. With an improved sliding member obtained by the arrangement as above, according to the present invention, enhanced abrasion resistance and scuffing resistance are obtained that are better than those of the conventional sliding members having an ion-plating deposition layer not containing boron, with the CrN having the preferred orientation of the plane {100}, while maintaining the peeling resistance as excellent as with conventional sliding members having an ion-plating deposition layer not containing boron, with the CrN having the preferred orientation of the plane {100}.

14 Claims, 4 Drawing Sheets

SLIDING MEMBER

FIELD OF THE INVENTION

The present invention relates to a sliding member, such as a piston ring for use in internal combustion engines, having an ion-plating deposition layer, or film, of chrome nitride formed on the sliding surface thereof.

BACKGROUND OF THE INVENTION

For a sliding member, such as a piston ring for use in internal combustion engines, a technique of enhancing the abrasion resistance thereof has been made public in Japanese Patent Laid-Open Publication (JP-A) 8-296030 (1996), where the enhancement is enabled by forming an ion-plating deposition layer of CrN, also including $Cr_2N$, on the external circumferential sliding surface thereof, by means of a physical vapor deposition (PVD) method.

There are two types in the publicly known ion-plating deposition layers composed mainly of chrome nitride including $Cr_2N$ and CrN, i.e., one type of deposition layer having the CrN of the chrome nitride which has a preferred orientation of the plane {111}, and the other type having the CrN of the chrome nitride which has a preferred orientation of the plane {100}. A deposition layer of the CrN having the preferred orientation of the plane {111}, is superior in abrasion resistance and scuffing resistance, but, due to having high internal stress, is inferior in peeling resistance, to a deposition layer of CrN having the preferred orientation of the plane {100}. On the contrary, or inversely, a deposition layer of the CrN having the preferred orientation of the plane {100}, is inferior in abrasion resistance and scuffing resistance, but, because of the porosity thereof being easily controllable, is superior in peeling resistance, to a deposition layer of the CrN having the preferred orientation of the plane {111}.

An object of the present invention therefore is to provide a sliding member having an ion-plating deposition layer, composed mainly of chrome nitride including $Cr_2N$ and CrN, that has abrasion resistance and scuffing resistance enhanced, or improved, while maintaining the excellent peeling resistance level of a deposition layer of the CrN having the preferred orientation of the plane {100}.

SUMMARY OF THE INVENTION

According to an embodiment of the present invention, an improved sliding member is provided that has a sliding surface and a deposition layer formed on the sliding surface by means of an ion-plating method, where the deposition layer is composed mainly of chrome nitride, including CrN. The improvement comprises the CrN of the chrome nitride which has a preferred orientation of the plane {100}, where the deposition layer contains boron at a containing ratio not less than 0.05 and not more than 20 weight percent.

According to another embodiment of the present invention, an improved sliding member is provided that has a sliding surface and a deposition layer formed on the sliding surface by means of an ion-plating method, where the deposition layer is composed mainly of chrome nitride, including CrN. The improvement comprises the CrN of the chrome nitride which has a preferred orientation of the plane {100}, where the deposition layer contains boron, at a containing ratio not less than 0.05 and not more than 20 weight percent, and either one or both of oxygen and carbon, at a containing ratio of the either one of oxygen and carbon, or a total containing ratio of the both oxygen and carbon, not more than 15 weight percent, respectively.

With an improved sliding member obtained by the arrangement as described above, according to the present invention, enhanced abrasion resistance and scuffing resistance are obtained that are better than those of the conventional sliding members having an ion-plating deposition layer not containing boron, with the CrN having the preferred orientation of the plane {100}, while maintaining the peeling resistance as excellent as that of the conventional sliding members having an ion-plating deposition layer not containing boron, with the CrN having the preferred orientation of the plane {100}.

The reason that abrasion resistance and scuffing resistance of the deposition layer are enhanced by adding boron, may be described in that, boron is considered to have a higher free composing energy in chrome than other elements, such as carbon, oxygen and nitrogen, have in chrome, and boron therefore is hard to form boride, and tends to form solid solution either in chrome or chrome nitride of CrxN, thereby producing a greater effect on strengthening the base of the deposition layer, resulting in enhanced abrasion resistance and scuffing resistance.

DETAILED DESCRIPTION OF ILLUSTRATIVE EMBODIMENTS

Figure 1:
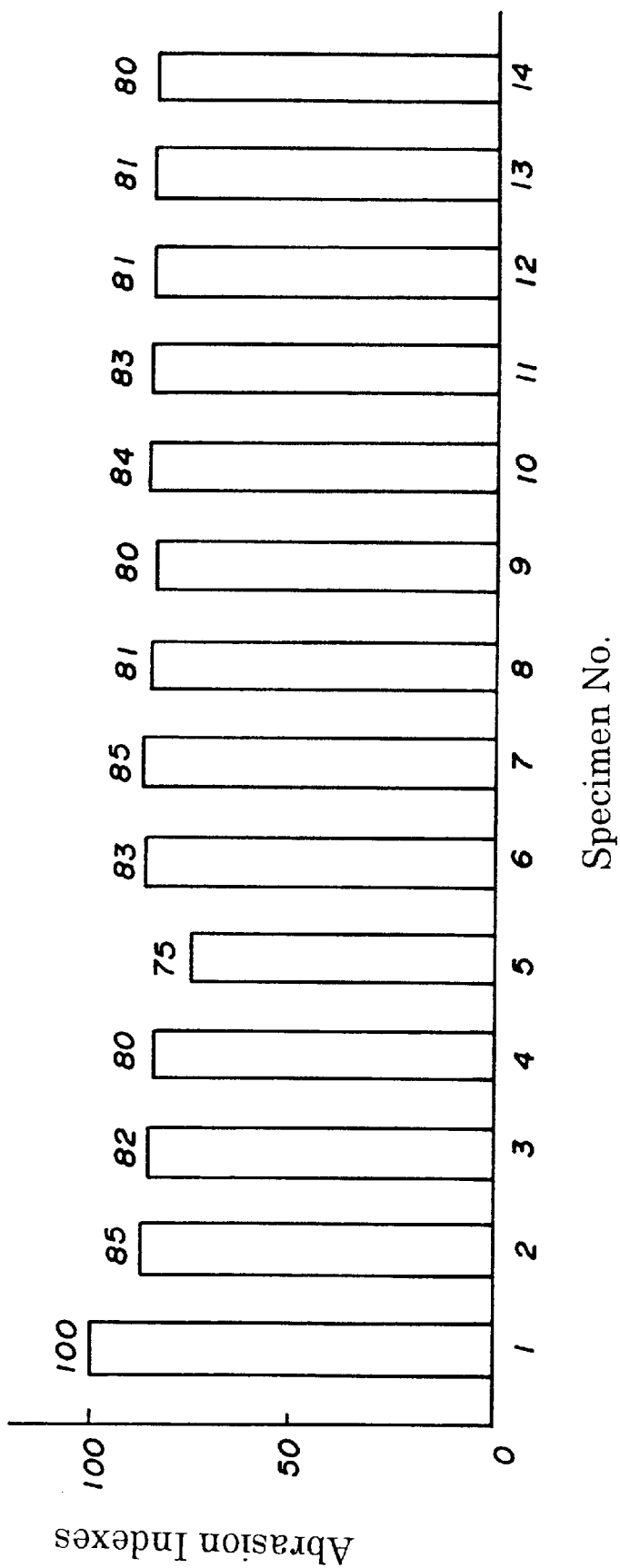
FIG. 1 is a graph showing the result of an abrasion test in terms of abrasion indexes.

A sliding member, according to the present invention, may be arranged by having an ion-plating deposition layer, or film, formed on the external circumferential sliding surface thereof, composed of chrome nitride, containing boron therein, by means of an ion-plating method, in nitrogen atmosphere, using chrome boron (Cr—B) alloy as the target in the ion-plating method. The chrome nitride of the deposition layer is composed mainly of CrN, though also including $Cr_2N$, where the CrN has a preferred orientation of the plane {100}. The content of boron in the deposition layer is adjusted to be within a range of 0.05 to 20 weight percent, by means of adjusting the composition of the Cr—B alloy. The range of boron content is so defined because, if the boron content in the deposition layer is less than 0.05 weight percent, then, abrasion resistance and scuffing resistance of the deposition layer are not improved, and because if the boron content in the deposition layer exceeds 20 weight percent, then, peeling resistance of the deposition layer is considerably decreased.

Instead of nitrogen gas, as the ion-plating atmosphere, a different atmosphere may be used for the ion plating that is selected from a group of a mixed gas of nitrogen and hydrocarbon, and a mixed gas of nitrogen, oxygen and hydrocarbon, which may cause the deposition layer to contain either one or both of oxygen and carbon. In this case, the content of the either one or both of oxygen and carbon in the deposition layer is adjusted to be not more than 15 weight percent. The range is so defined because, if the content of the either one or both of oxygen and carbon in the deposition layer exceeds 15 weight percent, then, peeling resistance of the deposition layer is considerably decreased.

EXAMPLES OF THE EMBODIMENTS

Advantageous characteristics of sliding members, according to the present invention, will be discussed more in detail hereunder, using examples of embodiments, or inventive sample specimens, of the present invention (Nos. 2.4, 6–8, 10–12, and 14), in comparison with comparative sample specimens (Nos. 6, 9, and 13) and a conventional sample specimen (No. 1), by referring to various tests conducted involving those sample specimens.

Using an ion-plating apparatus, fourteen types of deposition layers, or films, were formed on the respective base materials of the same piston ring cast iron to obtain sample specimens for the tests. At that time, those specimens were applied with a bias voltage of –50V. The deposition layer of all the specimens was composed mainly of chrome nitride, including CrN, where the CrN had a preferred orientation of the plane {100}.

For the specimens (Nos. 2–14), the deposition layer was arranged to contain either boron, boron and oxygen, boron and carbon, or boron, oxygen and carbon, where the boron contents and contents of oxygen and carbon in the specimen layers were adjusted by varying the composition of Cr—B alloy in the target, and the ratios of nitrogen, oxygen and carbon in the atmospheric gas, respectively. The comparative sample specimens (No. 5, 9, and 13) were all arranged to have a containing ratio, of boron and either one or both of oxygen and carbon, outside the range defined by the present invention. The conventional sample specimen (No. 1) was arranged not to contain boron.

The category and containing ratios other than chrome nitride of each specimen is shown in Table 1 below, where Convention, Inventive, and Comparative, mean conventional, inventive, and comparative samples, respectively.

TABLE 1

| Specimen | Category | Containing ratios other than chrome nitride (weight %) |
|---|---|---|
| No. 1 | Convention | B: 0% |
| No. 2 | Inventive | B: 0.05% |
| No. 3 | Inventive | B: 10% |
| No. 4 | Inventive | B: 20% |
| No. 5 | Comparative | B: 25% |
| No. 6 | Inventive | B: 10%, O: 1% |
| No. 7 | Inventive | B: 10%, O: 7.5% |
| No. 8 | Inventive | B: 10%, O: 15% |
| No. 9 | Comparative | B: 10%, O: 20% |
| No. 10 | Inventive | B: 10%, C: 1% |
| No. 11 | Inventive | B: 10%, C: 7.5% |
| No. 12 | Inventive | B: 10%, C: 15% |
| No. 13 | Comparative | B: 10%, C: 20% |
| No. 14 | Inventive | B: 10%, O: 8%, C: 7% |

(Abrasion Test)

For the test, lubricating oil was held in the reservoir of a testing machine (not shown). A disk-like counterpart material piece was partially dipped in the oil, and was rotated at a constant speed. Under this condition, each specimen was pressed with a load against the external circumferential surface of the counterpart material piece, and, after a specified period of time, the amount of abrasion was measured.

Testing conditions were as follows:
Testing Machine: Amsler Abrasion Tester,
Counterpart Material: FC25,
Lubricating Oil: Bearing Oil,
Oil Temperature: 80 degrees C,
Peripheral Speed: 1 m/s,
Load: 150 Kg, and
Time: 7 hours.

FIG. 1 is a graph showing the result of the abrasion test in terms of abrasion indexes, where the abrasion indexes were obtained on a basis of designating the abrasion amount of the conventional sample specimen (No. 1) as a reference index of 100.

As seen from FIG. 1, the inventive and comparative sample specimens (Nos. 2–14) containing boron, have abrasion resistance enhanced, or increased, compared with the conventional sample specimen (No. 1) not containing boron.

(Scuffing Test):

For the test, lubricating oil was held in the reservoir of a testing machine (not shown). A disk-like counterpart material piece was partially dipped in the oil, and was rotated at a constant speed. Under this condition, each specimen was pressed with a load against the external circumferential surface of the counterpart material piece, and load was periodically gradually increased until scuffing occurred, when the load was measured as a critical load causing scuffing.

Testing conditions were as follows:
Testing Machine: Amsler Abrasion Tester,
Counterpart Material: FC25,
Lubricating Oil: No.2 Spindle Oil, and
Peripheral Speed: 1 mis.

Figure 2:
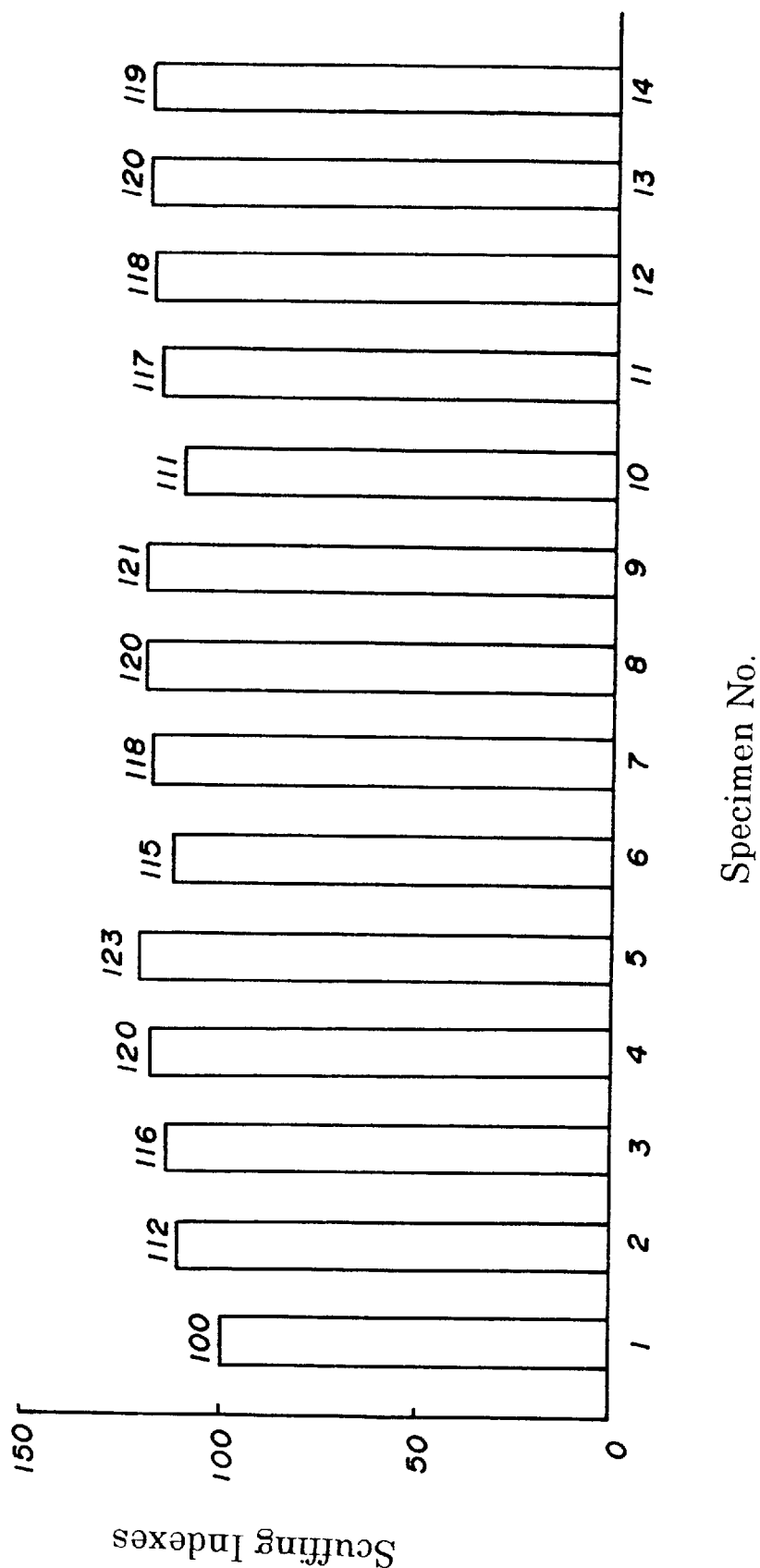
FIG. 2 is a graph showing the result of a scuffing test in terms of scuffing indexes.

FIG. 2 is a graph showing the result of the scuffing test in terms of scuffing indexes, where the scuffing indexes were obtained on a basis of designating the critical load of the conventional sample specimen (No. 1) as a reference index of 100.

As seen from FIG. 2, the inventive and comparative sample specimens (Nos. 2–14), containing boron, have scuffing resistance enhanced, compared with the conventional sample specimen (No. 1) not containing boron.

(Peeling Test)

Figure 3:
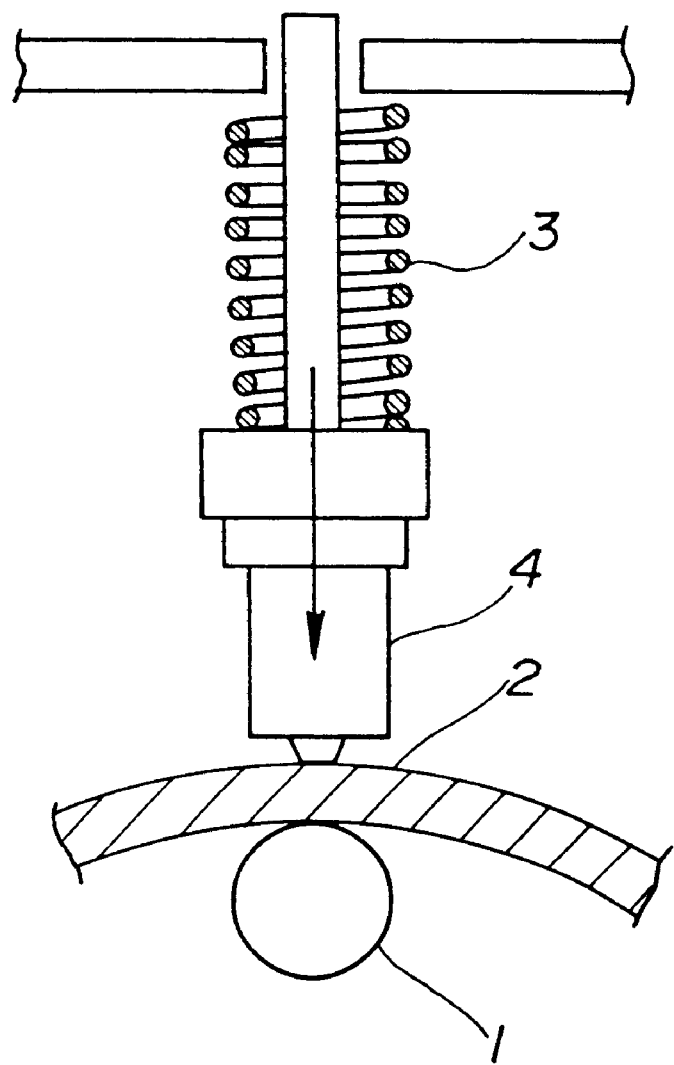
FIG. 3 is a schematic drawing showing a testing apparatus used in a peeling test.

A peeling test was conducted using an impact testing machine, as shown in FIG. 3. As shown by an arrow in FIG. 3, an indenter 4 energized by a spring 3, is caused to impinge on the surface of the deposition layer, or film, 2 of a specimen placed on a back block 1. With an impact energy of 43.1 mJ (4.4 Kgfmm) at each impingement, the impingements were repeatedly applied until peeling occurred, when the number of impingements applied was measured. The peeling occurrence was determined by observing the layer surface magnified by a power of 15.

Figure 4:
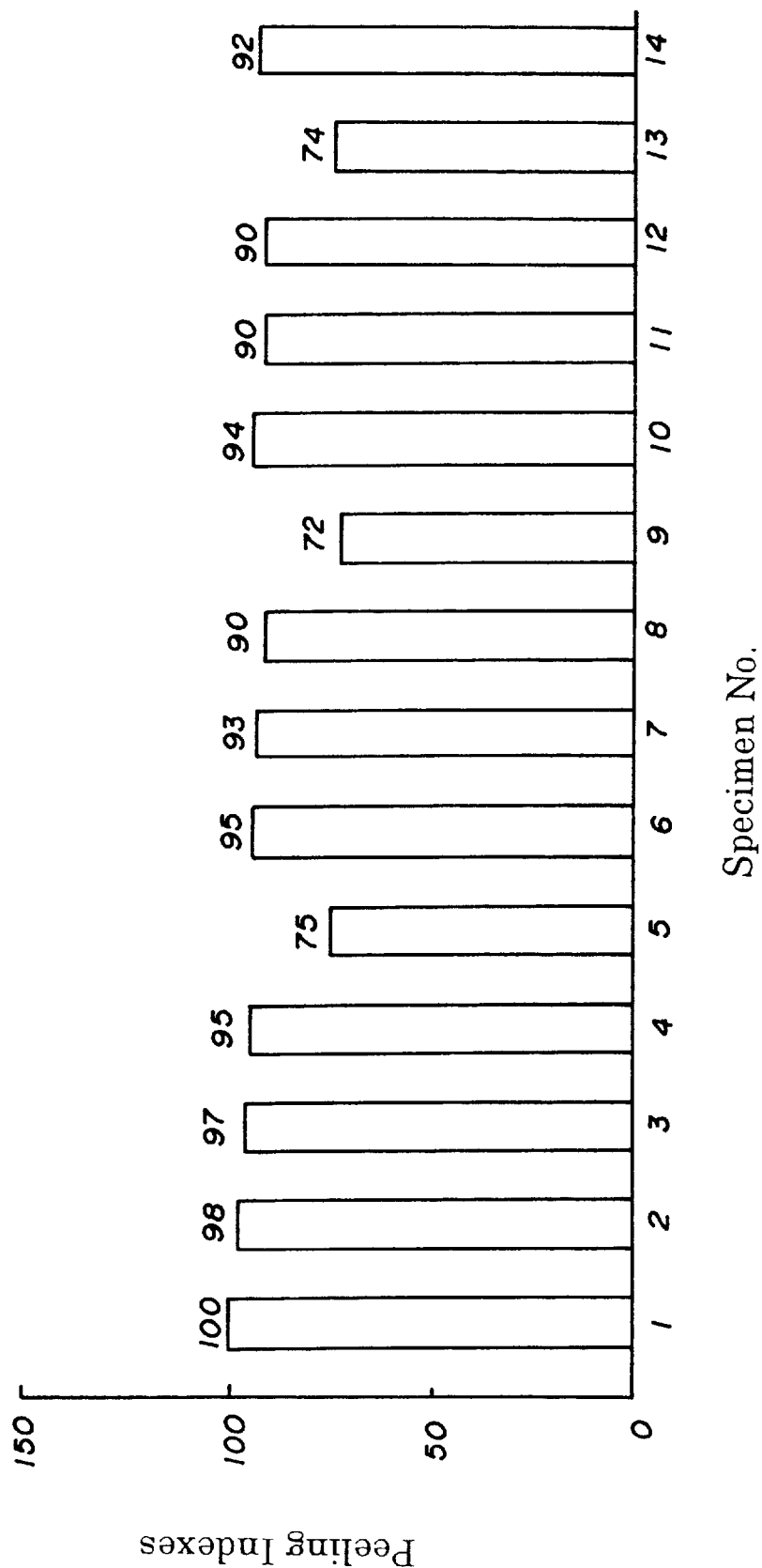
FIG. 4 is a graph showing the result of a peeling test in terms of peeling indexes.

FIG. 4 is a graph showing the result of the peeling test in terms of peeling indexes, where the peeling indexes were obtained on a basis of designating, as a reference index of 100, the number of impingements applied to conventional sample specimen (No. 1) until peeling occurred.

As seen from FIG. 4, the inventive sample specimens (Nos. 2–4, 6–8, 10–12 and 14), have peeling resistance decreased only by 2–10% in terms of peeling indexes from that, i.e., 100, of the conventional sample specimen (No. 1), whereby peeling resistance of those inventive samples may be said to be substantially the same as that of the conventional sample specimen (No. 1). On the contrary, as seen also from FIG. 4, the comparative sample specimens (Nos. 5, 9 and 13), have peeling resistance sharply decreased by 25–28% in terms of peeling indexes from that of the conventional sample specimen (No. 1).

As described above, a sliding member, according to the present invention, is an improved sliding member having an ion-plating deposition layer, or film, composed mainly of chrome nitride including CrN having a preferred orientation of the plane {100}, wherein the deposition layer contains boron at a containing ratio not less than 0.05 and not more than 20 weight percent, and the deposition layer may also contain either one or both of oxygen and carbon, at a containing ratio of the either one of oxygen and carbon, or a total containing ratio of the both oxygen and carbon, not more than 15 weight percent. Therefore, an improved sliding member, according to the present invention, has an advantage in that the ion-plating deposition layer, or film thereof, with the CrN having the preferred orientation of the plane {100}, has abrasion resistance and scuffing resistance increased, in comparison with conventional deposition layers not containing boron, with the CrN having the preferred orientation of the plane {100}, while maintaining substantially the same level of peel resistance as that of conventional deposition layers not containing boron, with the CrN having the preferred orientation of the plane {100}.

What is claimed is:

1. An improved sliding member having a sliding surface and a deposition layer formed on said sliding surface by means of an ion-plating method, said deposition layer being composed mainly of chrome nitride, including CrN; wherein the improvement comprises:

said CrN of said chrome nitride having a preferred orientation of the plane {100}; and said deposition layer containing boron at a containing ratio not less than 0.05 and not more than 20 weight percent.

2. An improved sliding member having a sliding surface and a deposition layer composed mainly of chromium nitride, including CrN, wherein the sliding member is improved so that:

(1) said CrN in said layer containing chrome nitride has a preferred orientation of the plane {100}; and (2) said deposition layer also combines (a) boron in a containing ratio of not less than 0.05 and not more than 20 weight percent; and (b) at least one member, selected from the group consisting of carbon and oxygen, the total containing ratio of said carbon and oxygen, respectively, being not more than 15 weight percent.

3. The improved sliding member according to claim 2, wherein said sliding member is a piston.

4. The improved sliding member according to claim 2, wherein said sliding member is a piston ring for internal combustion engines.

5. The improved sliding member according to claim 2, wherein the amount of boron is 0.05 weight percent.

6. The improved sliding member, according to claim 2, wherein the amount of boron is 10 percent by weight.

7. The improved sliding member according to claim 2, wherein the amount of boron is 20 percent by weight.

8. The improved sliding member according to claim 2, wherein the amount of boron is 10% by weight and oxygen is 1% by weight.

9. The improved sliding member according to claim 2, wherein the amount of boron is 10% by weight, and the amount of oxygen is 7.5% by weight.

10. The improved sliding member according to claim 2, wherein the amount of boron is 10% by weight and the oxygen is 15% by weight.

11. The improved sliding member according to claim 2, wherein the amount of boron is 10% by weight and carbon is 1% by weight.

12. The improved sliding member according to claim 2, wherein the amount of boron is 10% by weight and carbon is 7.5% by weight.

13. The improved sliding member according to claim 2, wherein the amount of boron is 10% by weight and carbon is 15% by weight.

14. The improved sliding member according to claim 2, wherein the amount of boron is 10% by weight, oxygen is 8% by weight, and carbon is 7% by weight.

* * * * *